(12) United States Patent
Lou

(10) Patent No.: US 10,084,150 B1
(45) Date of Patent: Sep. 25, 2018

(54) TRANSPARENT OLED PANEL AND DISPLAY DEVICE

(71) Applicant: Shanghai Tianma Micro-Electronics Co., Ltd., Shanghai (CN)

(72) Inventor: Junhui Lou, Shanghai (CN)

(73) Assignee: SHANHAI TIANMA MICRO-ELECTRONIC CO., LTD. (CN)

( * ) Notice: Subject to any disclaimer, the term of this patent is extended or adjusted under 35 U.S.C. 154(b) by 0 days.

(21) Appl. No.: 15/790,405

(22) Filed: Oct. 23, 2017

(30) Foreign Application Priority Data

May 23, 2017 (CN) .......................... 2017 1 0367838

(51) Int. Cl.
| | | |
|---|---|---|
| *H01L 51/00* | (2006.01) | |
| *H01L 51/52* | (2006.01) | |
| *H01L 27/32* | (2006.01) | |
| *H01L 51/56* | (2006.01) | |

(52) U.S. Cl.
CPC ...... *H01L 51/5225* (2013.01); *H01L 27/3218* (2013.01); *H01L 27/3262* (2013.01); *H01L 27/3276* (2013.01); *H01L 51/0021* (2013.01); *H01L 51/5234* (2013.01); *H01L 51/56* (2013.01); *H01L 2227/323* (2013.01); *H01L 2251/558* (2013.01)

(58) Field of Classification Search
CPC ............... H01L 27/124; H01L 27/1225; H01L 27/1259; H01L 27/1222; H01L 27/1255; H01L 27/1248; H01L 51/5253; H01L 21/31111; H01L 21/47573; H01L 21/76802; H01L 2251/5323; H01L 27/1262; H01L 27/127
See application file for complete search history.

(56) References Cited

U.S. PATENT DOCUMENTS 9,786,864 B2 * 10/2017 Lou .......................... H01L 51/52

FOREIGN PATENT DOCUMENTS

CN    103346271 B    1/2016

* cited by examiner

*Primary Examiner* — Robert Bachner
(74) *Attorney, Agent, or Firm* — Tarolli, Sundheim, Covell & Tummino LLP

(57) ABSTRACT

A transparent OLED panel and a display device are provided. The transparent OLED panel includes a cathode layer, which includes a cathode area and a plurality of hollow areas arranged in a matrix. The cathode area includes continuous coverage portions and narrow portions. Each continuous coverage portion includes flat areas arranged along the second direction and strip-shaped protrusion areas extending along the first direction and arranged along the second direction. The transparent OLED panel further includes a plurality of signal lines extending along the first direction. In a direction perpendicular to a plane where the panel is located, an orthogonal projection of the signal lines overlaps with an orthogonal projection of part of the narrow portions and an orthogonal projection of part of the strip-shaped protrusion areas.

15 Claims, 13 Drawing Sheets

_US 10,084,150 B1_

TRANSPARENT OLED PANEL AND DISPLAY DEVICE

CROSS-REFERENCE TO RELATED APPLICATIONS

The present application claims priority to Chinese Patent Application No. 201710367838.8, filed on May 23, 2017, the content of which is incorporated herein by reference in its entirety.

TECHNICAL FIELD

The present disclosure relates to the field of display technologies and, particularly, relates to a transparent OLED panel and display device.

BACKGROUND

A transparent organic light-emitting diode (OLED) display product refers to a display product that uses an organic light-emitting material to achieve display function and has transparency effect. The transparent OLED display product includes a display panel on which a cathode layer is arranged. The cathode layer includes hollow areas for achieving transparent display effect. Usually in the process of producing the cathode layer, a mask is required for masking the hollow areas, and then the cathode layer is formed by an evaporation process. According to the conventional mask design concept, an ideal mask has metal masking structures corresponding to the hollow areas. However, since the metal masking structures are required to be independent from each other and suspended in the air, it is technically impossible to achieve the ideal mask, as a result, the cathode layer structure having separate hollow areas cannot be formed.

SUMMARY

The present disclosure provides a transparent OLED panel and display device with increased emission brightness and improved transmittance. These advantages are achieved by employing a cathode layer structure with separate hollow areas, which can be achieved by evaporation.

In a first aspect, the present disclosure provides a transparent OLED panel, including: a substrate; a thin film transistor array layer located on the substrate; an organic light-emitting device located at a side of the thin film transistor array layer away from the substrate; and a plurality of signal lines. In a direction away from the substrate, the organic light-emitting device includes successively a first electrode layer, a light-emitting layer and a second electrode layer, at least one of the first electrode layer and second electrode layer is a cathode layer. The cathode layer includes a cathode area and a plurality of hollow areas arranged in a matrix. The cathode area includes a plurality of continuous coverage portions and a plurality of narrow portions. The plurality of narrow portions is arranged in a matrix. In each row of the plurality of narrow portions, multiple narrow portions extend along a first direction and arranged along a second direction perpendicular to the first direction, one continuous coverage portion is arranged between every two adjacent row of the plurality of hollow areas. In each row of the plurality of hollow areas, one narrow portion is arranged between every two adjacent hollow areas, each continuous coverage portion includes multiple flat areas and multiple strip-shaped protrusion areas, the multiple flat areas are arranged along the second direction, the multiple strip-shaped protrusion areas extend along the first direction and arranged along the second direction. One flat area is arranged between any two adjacent strip-shaped protrusion areas, and one strip-shaped protrusion area is arranged between any two adjacent flat areas. A thickness of the cathode layer at the protrusion areas is larger than a thickness of the cathode layer at the flat areas. The plurality of signal lines extends along the first direction. In a direction perpendicular to a plane where the panel is located, an orthogonal projection of the plurality of signal lines overlaps with an orthogonal projection of at least part of the narrow portions, the orthogonal projection of the plurality of signal lines overlaps with an orthogonal projection of at least a part of the strip-shaped protrusion areas.

In another aspect, the present disclosure provides a display device, and the display device includes the transparent OLED panel described above.

For the transparent OLED panel and the display device provided by the embodiments of the present disclosure, the cathode layer structure having separate hollow areas can be achieved by evaporation. Besides, compared with a solution that the signal lines overlap with the strip-shaped protrusion area or the narrow portion in the prior art, the influence of the cathode layer on the transmittance can be decreased by making the signal lines overlap with both the narrow portion (which influences the transmittance) and the strip-shaped protrusion area of the cathode layer, which can increase the emission brightness while improving the transmittance.

BRIEF DESCRIPTION OF DRAWINGS

In order to more clearly illustrate technical solutions in embodiments of the present disclosure, the accompanying drawings used in the embodiments are briefly introduced as follows. Obviously, the drawings described as follows are merely part of the embodiments of the present disclosure, and other drawings can also be acquired by those skilled in the art without paying creative efforts.

DESCRIPTION OF EMBODIMENTS

In order to better understand technical solutions of the present disclosure, the present disclosure will be illustrated in detail with reference to the accompanying drawings.

It should be understood that, the described embodiments are merely exemplary embodiments of the present disclosure, which shall not be interpreted as limiting the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments and not intended to limit the present disclosure. Unless otherwise noted in the context, the singular form expressions "a", "an", "the" and "said" used in the embodiments and appended claims of the present disclosure are also intended to represent a plural form.

Figure 1:
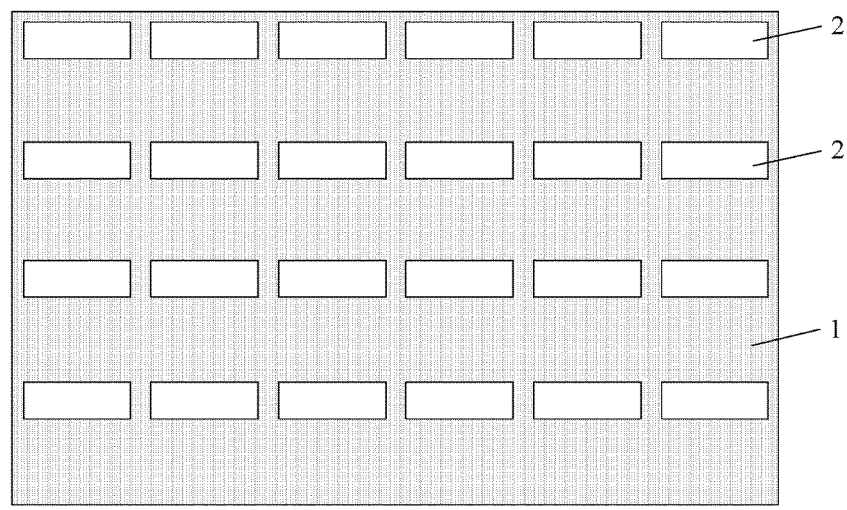
FIG. 1 illustrates a structural schematic diagram of a cathode layer of a transparent OLED panel in the prior art.
Figure 2:
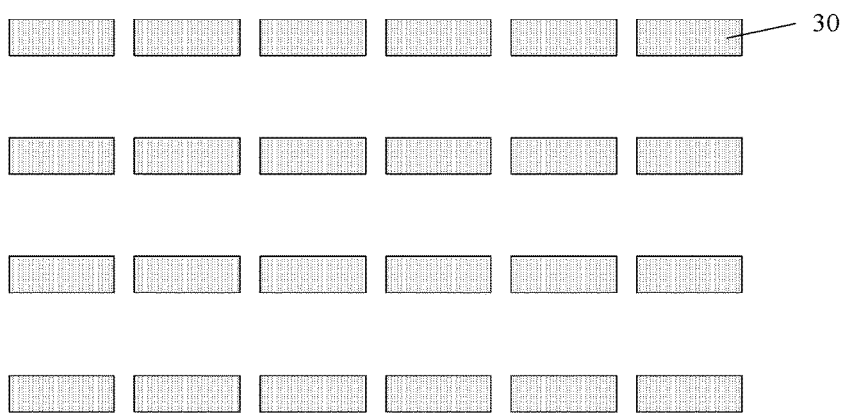
FIG. 2 illustrates a structural schematic diagram of an ideal mask used for cathode layer evaporation in the prior art.

A transparent organic light-emitting diode (OLED) display product refers to a display product that uses an organic light-emitting material to achieve display function and has transparency effect. The transparent OLED display product includes a display panel on which a cathode layer is arranged, as shown in FIG. 1, the cathode layer 1 includes hollow areas 2 for achieving transparent display effect. In order to produce the pattern of the cathode layer as shown in FIG. 1, a mask is required for masking the hollow areas 2, and then the cathode layer 1 having the hollow areas 2 is formed by an evaporation process. According to a conventional mask design concept, an ideal mask is as shown in FIG. 2, which has metal masking structures 30 respectively corresponding to the hollow areas. However, since the metal masking structures 30 as shown in FIG. 3 are independent from each other and suspended in the air, the mask is technically impossible to be achieved, as a result, the cathode layer 1 having separate hollow areas 2 cannot be formed.

Figure 3:
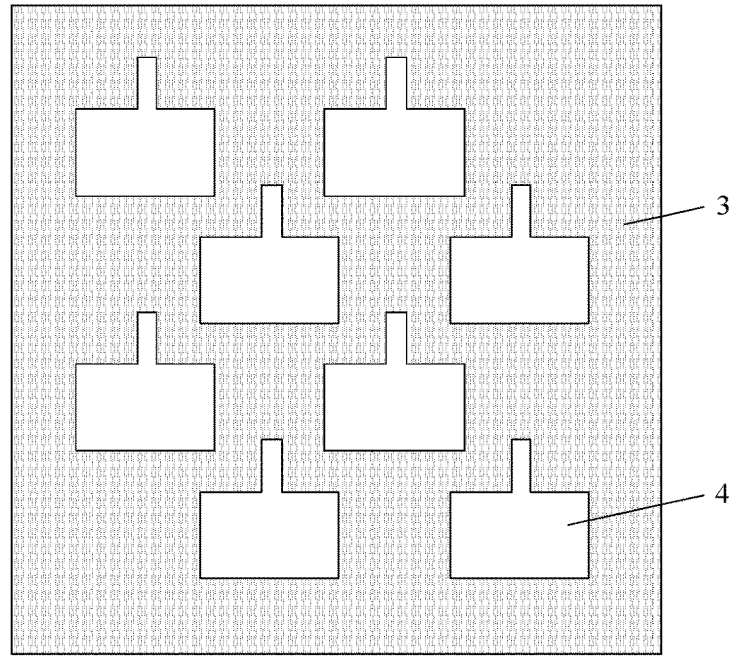
FIG. 3 illustrates a structural schematic diagram of a mask used for cathode layer evaporation in the prior art.
Figure 4:
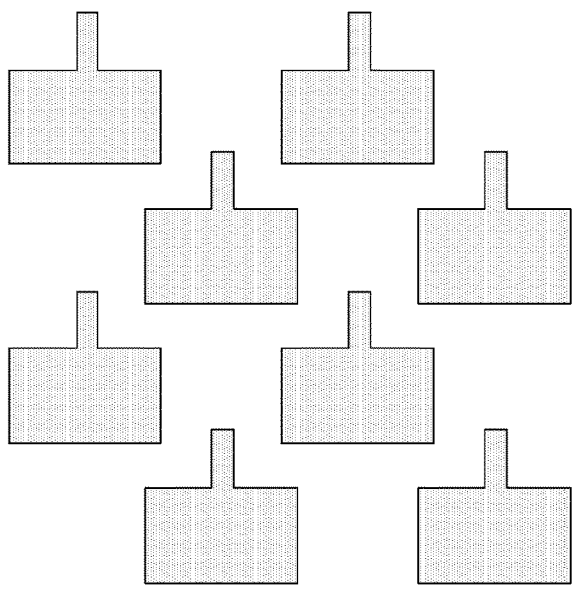
FIG. 4 illustrates a structural schematic diagram of a cathode layer structure obtained by evaporation using the mask in FIG. 3 for a first time.
Figure 5:
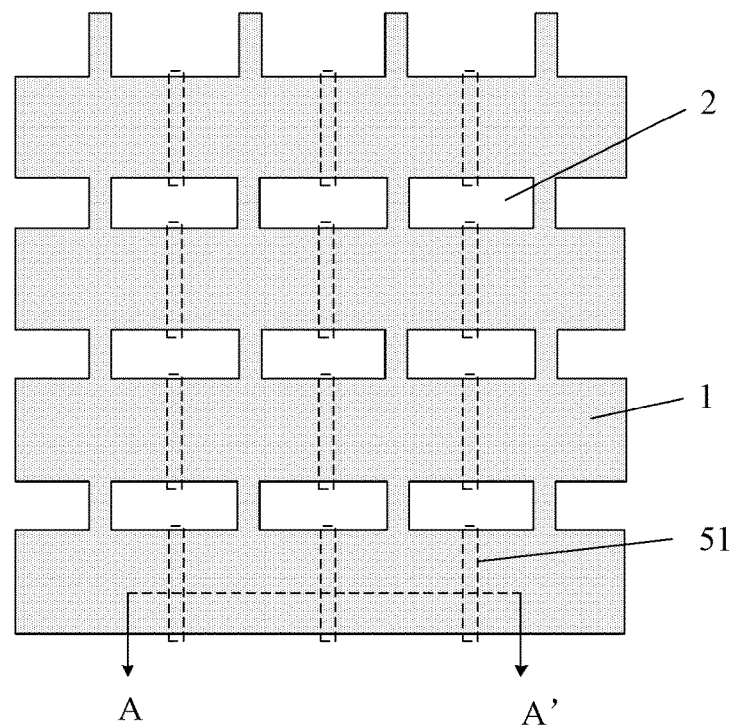
FIG. 5 illustrates a structural schematic diagram of a cathode layer structure obtained by evaporation using the mask in FIG. 3 for a second time.
Figure 6:
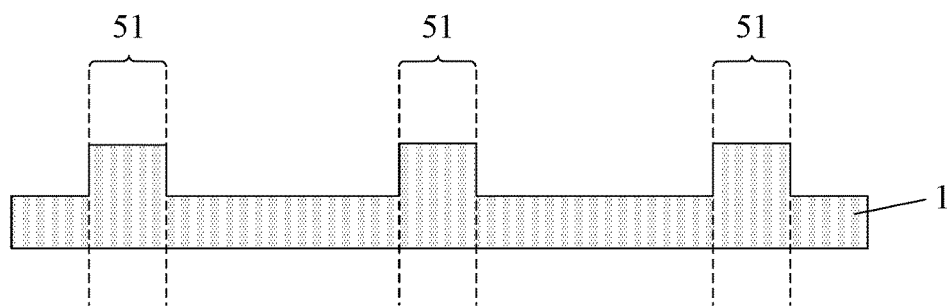
FIG. 6 illustrates a cross-sectional structural schematic diagram along direction AA' in FIG. 5.
Figure 7:
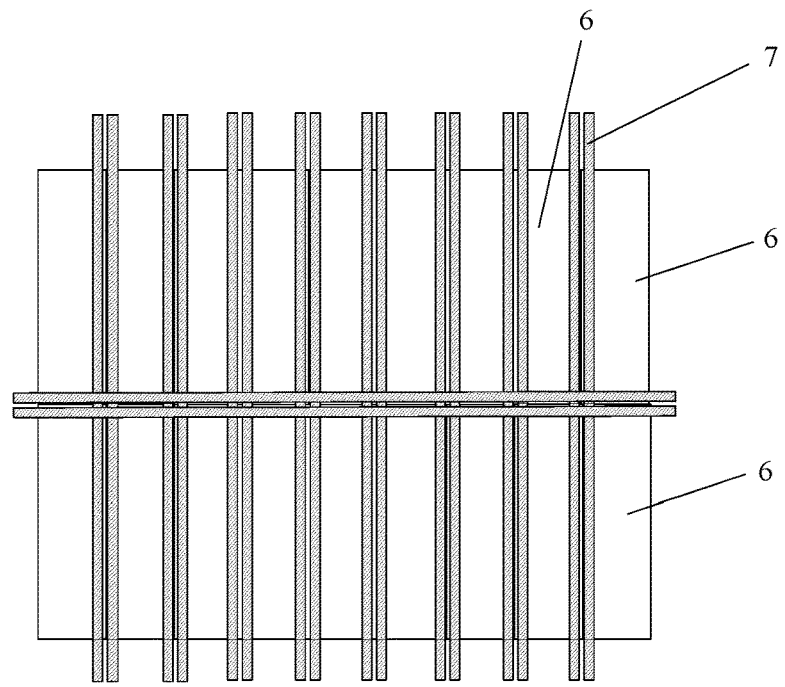
FIG. 7 illustrates a structural schematic diagram showing signal lines aligned with sub-pixel units in the prior art.

Before describing the embodiments of the present disclosure, please refer to FIGS. 3-7, wherein FIG. 3 illustrates a structural schematic diagram of a mask used for cathode layer evaporation in the prior art; FIG. 4 illustrates a structural schematic diagram of a cathode layer structure obtained by evaporation using the mask in FIG. 3 for the first time; FIG. 5 illustrates a structural schematic diagram of a cathode layer structure obtained by evaporation using the mask in FIG. 3 for the second time; FIG. 6 illustrates a cross-sectional structural schematic diagram along direction AA' in FIG. 5; and FIG. 7 illustrates a structural schematic diagram showing signal lines aligned with sub-pixel units in the prior art. As shown in FIG. 3, a mask 3 in the prior art has T-shaped openings 4. After the evaporation process using the mask 3, a cathode layer structure as shown in FIG. 4 is formed, then the mask 3 is moved to change relative positions between the mask 3 and an array substrate, and then a second evaporation process is implemented, so that a cathode layer 1 structure as shown in FIG. 5 is formed, and the cathode layer 1 has a plurality of separate hollow areas 2. As shown in FIG. 7, the array substrate includes a plurality of sub-pixel units 6 arranged in a matrix, each sub-pixel unit 6 corresponds to one organic light-emitting device, each sub-pixel unit 6 is the smallest display unit, and a signal line 7 is arranged at a junction between two adjacent sub-pixel units 6.

In implementation of the present disclosure, the inventor has found that at least the following problems exist in the prior art:

1. For integrity of the cathode layer 1, twice evaporation processes are needed. However, the twice evaporation processes will form an overlapping portion, as shown in FIGS. 5 and 6, the cathode layer 1 formed after the twice evaporation processes has a strip-shaped protrusion area 51, the strip-shaped protrusion area 51 of the cathode layer 1 after twice evaporation is thicker, which makes it harder for light to pass through and it leads to low-transmittance.

2. During working of the display panel, the hollow areas 2 are used to achieve transparent effect, an area evaporated with the cathode layer material is used to make the organic light-emitting device to emit light, thereby achieving the display function. Therefore, the signal line 7 is arranged at the junction between two adjacent sub-pixel units 6. Since the signal line 7 is made of metal (for example, the signal line 7 may include a metal such as titanium and/or aluminum), the signal line 7 has a low transmittance with respect to light, which affects the transmission of light, thereby affecting the transmittance.

Figure 8:
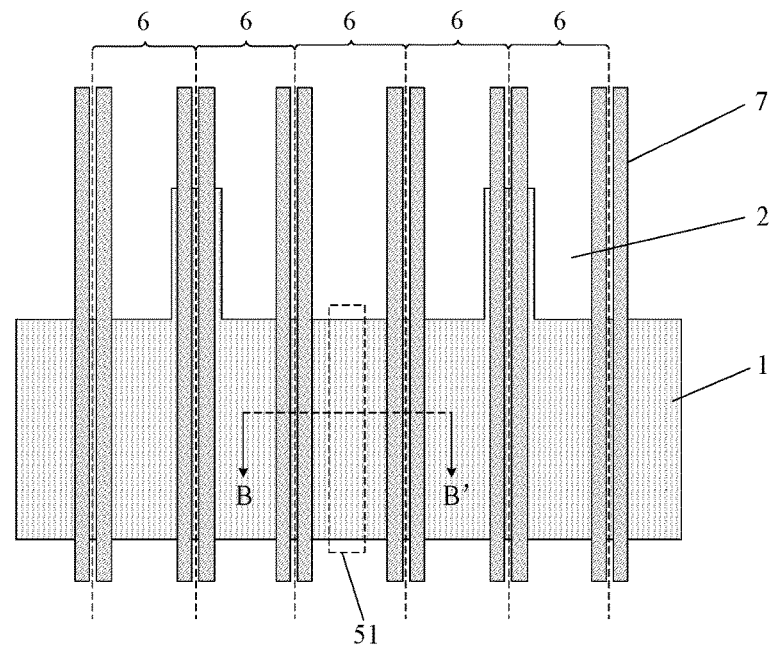
FIG. 8 illustrates a structural schematic diagram showing a cathode layer structure aligned with a sub-pixel unit in the prior art.
Figure 9:
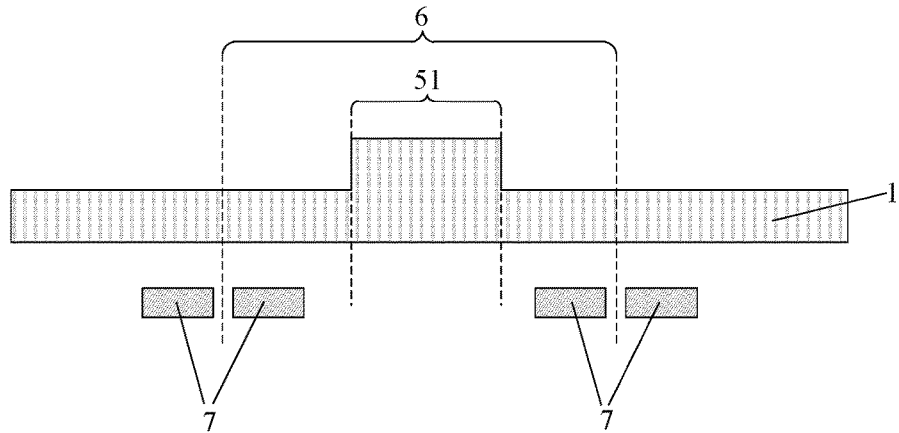
FIG. 9 illustrates a cross-sectional structural schematic diagram along direction BB' in FIG. 8.
Figure 10:
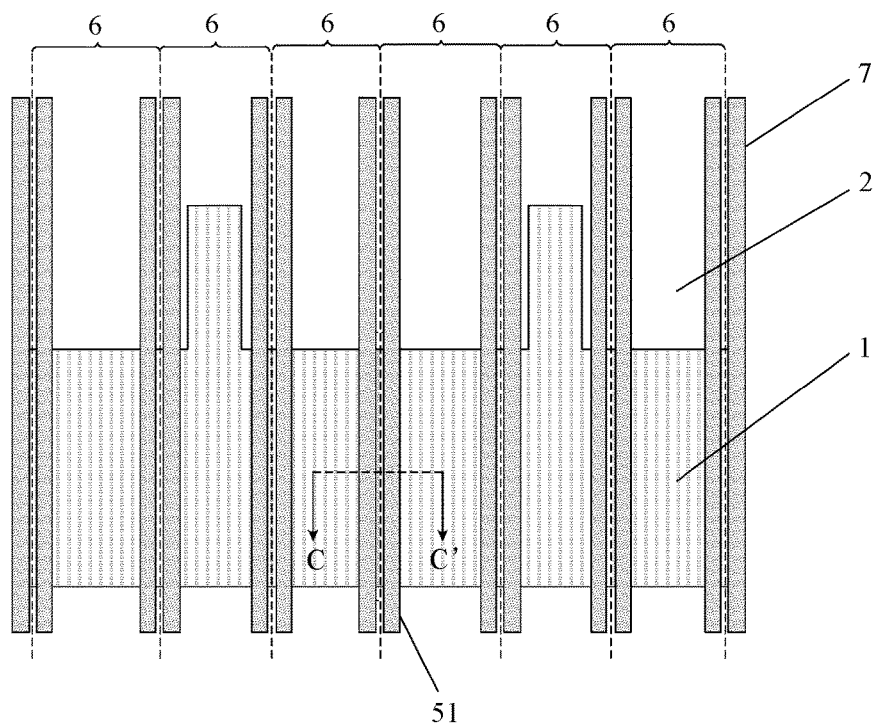
FIG. 10 illustrates another structural schematic diagram showing a cathode layer structure aligned with a sub-pixel unit in the prior art.
Figure 11:
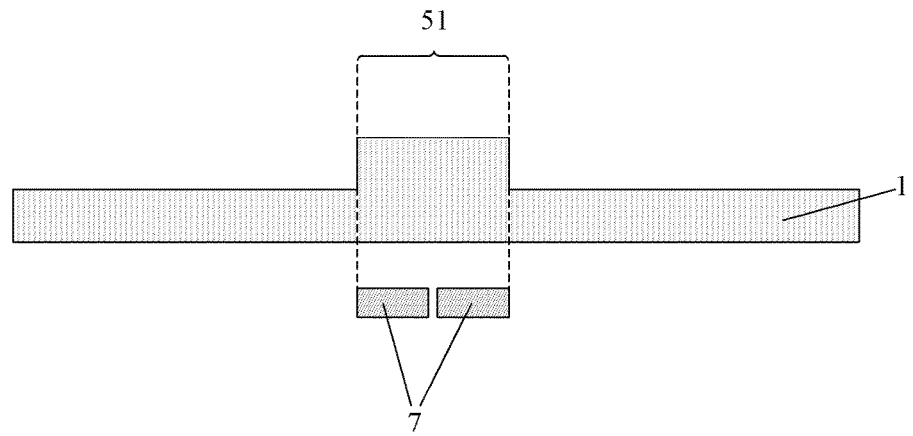
FIG. 11 illustrates a cross-sectional structural schematic diagram along direction CC' in FIG. 10.

3. Please refer to FIGS. 8-9, wherein FIG. 8 illustrates a structural schematic diagram showing a cathode layer structure aligned with a sub-pixel unit in the prior art; and FIG. 9 illustrates a cross-sectional structural schematic diagram along direction BB' in FIG. 8. There exist two manners for aligning the cathode layer 1 with the sub-pixel unit. One manner is as shown in FIGS. 8-9, wherein a portion of the cathode layer 1 between two adjacent hollow areas 2 is arranged at the junction between the sub-pixel units 6, so as to improve the transmittance; however, the inventor has found that, it will cause the strip-like protrusion area 51 to be located at a middle position on the sub-pixel unit 6. In addition, the thickness of the cathode layer 1 is in negative correlation with the transmittance of the cathode layer 1, as a result, when the strip-like protrusion area 51 is located at the middle position of the sub-pixel unit 6, the emission brightness of this sub-pixel unit 6 will be decreased. Besides, since the signal line 7, which has an adverse effect on the transmittance, is arranged at the junction between two adjacent sub-pixel units 6, and the signal line 7 does not overlap with the strip-like protrusion area 51, the emission brightness of the sub-pixel unit 6 is further decreased. In order to solve this problem, a width of the strip-shaped protrusion area 51 can be reduced so as to reduce the adverse effect of the strip protrusion area 51 on the emission brightness. However, the smaller the width of the strip-shaped protrusion area 51, the more easily the cathode layer breaks, and transmission of the signal on the entire cathode layer will be influenced, which not only increases transmission delay of the signal and thus reduces response speed of the display image, but also makes the signal pass a longer distance in transmission to the target position; accordingly, a higher loss will be caused, that is, the voltage values received at different positions on the cathode layer are greatly different, resulting in poor uniformity of display brightness at different positions. The other manner is as shown in FIGS. 10-11, wherein FIG. 10 illustrates another structural schematic diagram showing a cathode layer structure aligned with a sub-pixel unit in the prior art; FIG. 11 illustrates a cross-sectional structural schematic diagram along direction CC' in FIG. 10, wherein the strip-shaped protrusion area 51 of the cathode layer 1 is located at the junction between two adjacent sub-pixel units 6, so that the strip-shaped protrusion area 51, the junction between sub-pixel units 6, and the signal line 7 overlap with each other, thereby improving the emission brightness of the sub-pixel unit 6; however, it will cause the hollow areas 2 of the cathode layer 1 to correspond to more signal lines 7, resulting in decrease of the transmittance. In order to solve this problem, the width of the portion of the cathode layer between the hollow areas 2 can be decreased, however, the portion of the cathode layer between the protrusion areas 2 are used for transmitting current, and the smaller the width of this portion of the cathode layer, the greater the resistance of the portion, so that the decreased width of the portion is adverse to the transmission of the current on the entire cathode layer. In addition, the signal lines 7 can be made of a transparent conductive material so as to improve the transmittance, thereby achieving a better transparent display effect. However, conductivity of the transparent conductive material is poorer than that of a metallic material, which will increase transmission delay of the signal, thereby reducing the response speed of the display frame of the transparent OLED panel display screen.

Figure 12:
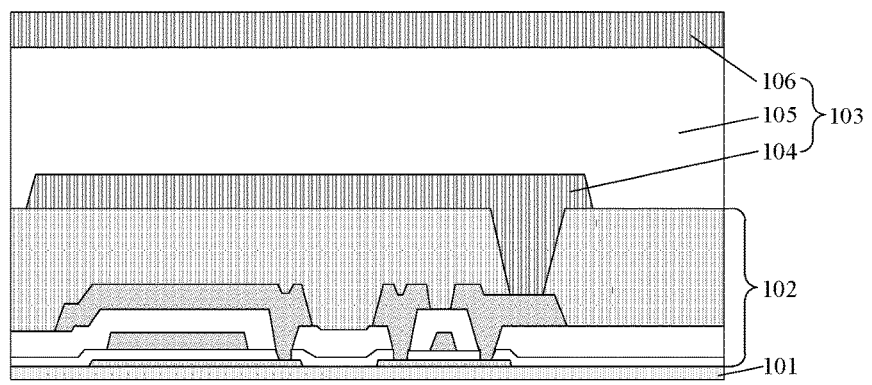
FIG. 12 illustrates a cross-sectional structural schematic diagram of a transparent OLED panel according to an embodiment of the present disclosure.
Figure 13:
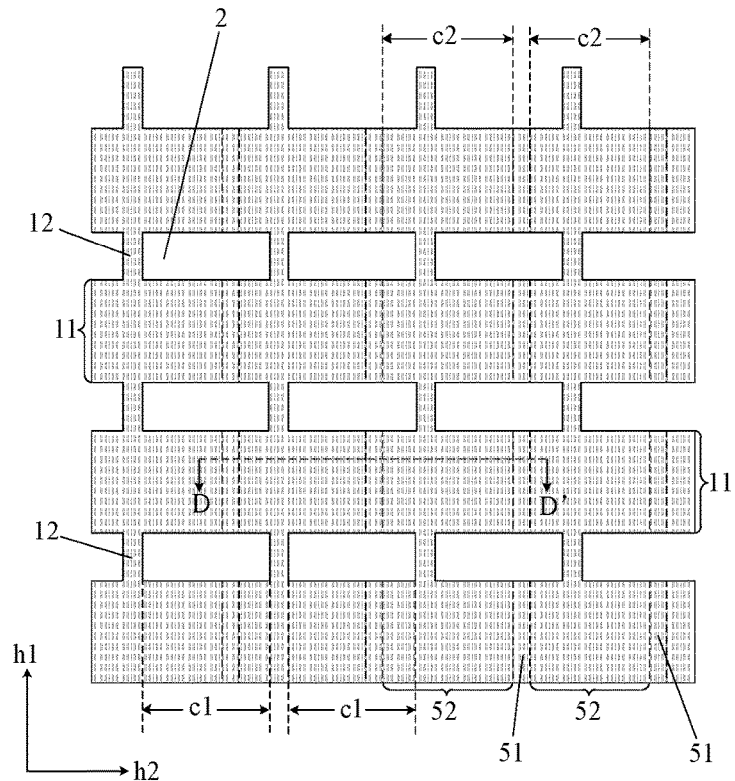
FIG. 13 illustrates a structural schematic diagram of a cathode layer of a transparent OLED panel according to an embodiment of the present disclosure.
Figure 14:
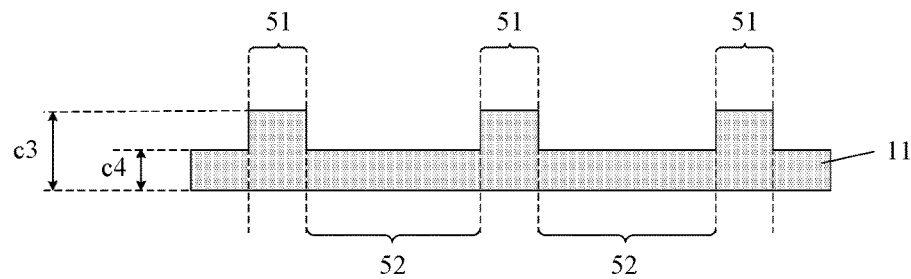
FIG. 14 illustrates a cross-sectional structural schematic diagram along direction DD' in FIG. 13.
Figure 15:
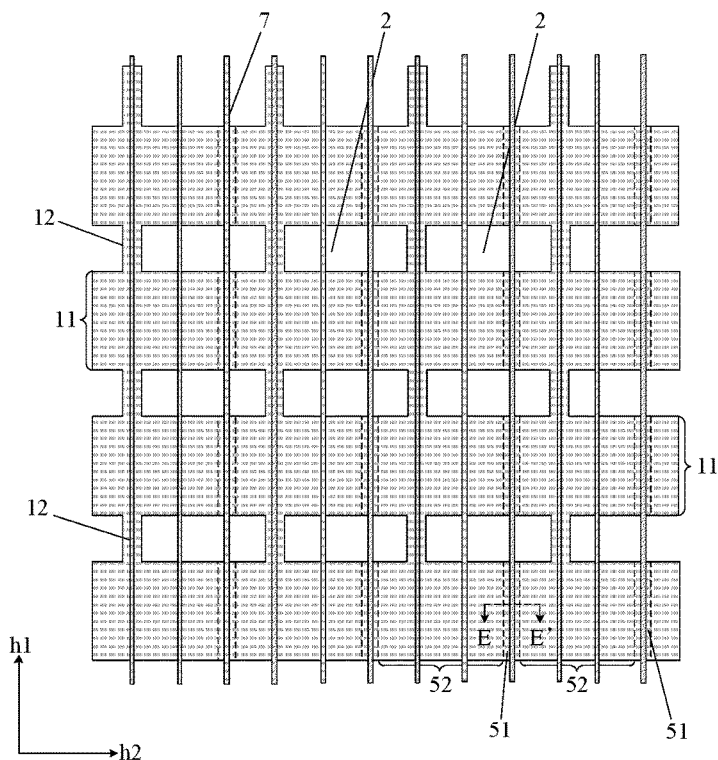
FIG. 15 illustrates a structural schematic diagram showing the cathode layer structure in FIG. 13 aligned with signal lines.
Figure 16:
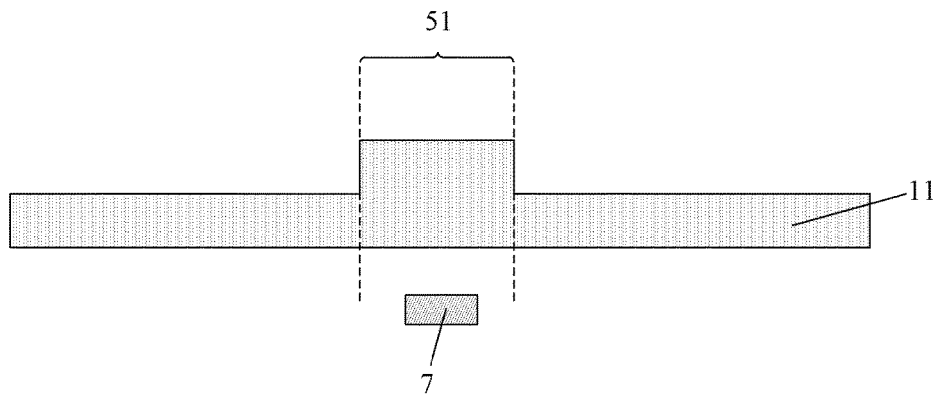
FIG. 16 illustrates a cross-sectional structural schematic diagram along direction EE' in FIG. 15.

In view of the above findings by the inventor, an exemplary embodiment of the present disclosure provides a transparent OLED panel and a display device, which can improve the emission brightness while increasing the transmittance. Please refer to FIGS. 12-16, wherein FIG. 12 illustrates a cross-sectional structural schematic diagram of a transparent OLED panel according to an embodiment of the present disclosure; FIG. 13 illustrates a structural schematic diagram of a cathode layer of a transparent OLED panel according to an embodiment of the present disclosure; FIG. 14 illustrates a cross-sectional structural schematic diagram along direction DD' in FIG. 13; FIG. 15 illustrates a structural schematic diagram showing the cathode layer structure in FIG. 13 aligned with signal lines; FIG. 16 illustrates a cross-sectional structural schematic diagram along direction EE' in FIG. 15. An exemplary embodiment of the present disclosure provides a transparent OLED panel, including: a substrate 101; a thin film transistor array layer 102 located on the substrate; and an organic light-emitting device 103 located at a side of the thin film transistor array layer 102 away from the substrate 101. In a direction away from the substrate 101, the organic light-emitting device 103 includes successively a first electrode layer 104, a light-emitting layer 105 and a second electrode layer 106, at least one of the first electrode layer 104 and second electrode layer 106 is a cathode layer, configuration of the cathode layer is as shown in FIG. 13, the cathode layer includes a cathode area (i.e., dot filling area shown in FIG. 13) and a plurality of hollow areas 2 arranged in a matrix, and the cathode area includes a plurality of continuous coverage portions and a plurality of narrow portions 12 arranged in a matrix. In each row of narrow portions 12, multiple narrow portions 12 extend along a first direction h1 and are arranged along a second direction h2 perpendicular to the first direction h1. One continuous coverage portion 11 is placed between every two adjacent rows of hollow areas 2. In each row of hollow areas 2, one narrow portion 12 is placed between every two adjacent hollow areas 2. As shown in FIGS. 13-14, each continuous coverage portion 11 includes multiple flat areas 52 and multiple strip-shaped protrusion areas 51, the multiple flat areas 52 are arranged along the second direction h2, the multiple strip-shaped protrusion areas 51 extend along the first direction h1 and are arranged along the second direction h2, one flat area 52 is placed between any two adjacent strip-shaped protrusion areas 51, and one strip-shaped protrusion area 51 is placed between any two adjacent flat areas 52. With reference to FIG. 14, the thickness c3 of the protrusion area 51 of the cathode layer is larger than the thickness c4 of the flat area 52 of the cathode layer. With reference to FIGS. 15-16, the above-described transparent OLED panel further includes signal lines 7 extending along the first direction h1; in a direction perpendicular to the plane where the panel is located, an orthogonal projection of the signal lines 7 overlaps with an orthogonal projection of at least part of the narrow portions 12, the orthogonal projection of the signal lines 7 overlaps with an orthogonal projection of at least part of the strip-shaped protrusion areas 51. Any two adjacent continuous coverage portions 11 are connected with each other by the narrow portions 12 to achieve electrical connection of the entire cathode layer.

The transparent OLED panel in the embodiments of the present disclosure is further illustrated by an evaporation method of the cathode layer.

Figure 17:
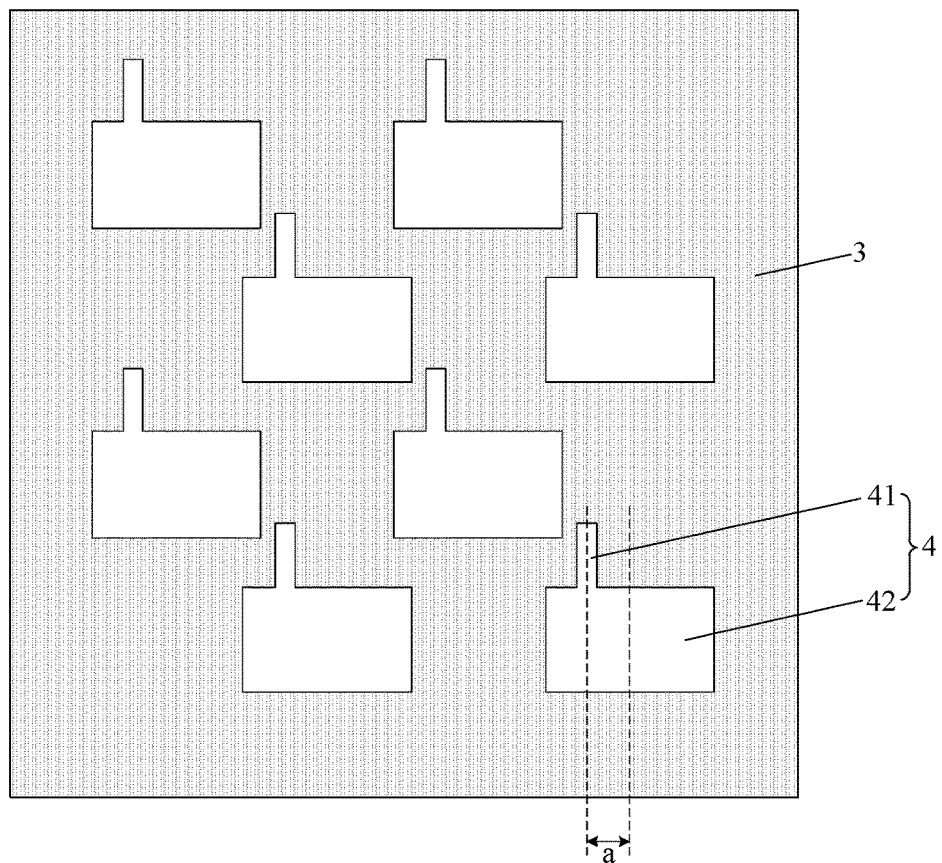
FIG. 17 illustrates a structural schematic diagram of a mask used for cathode layer evaporation according to an embodiment of the present disclosure.
Figure 18:
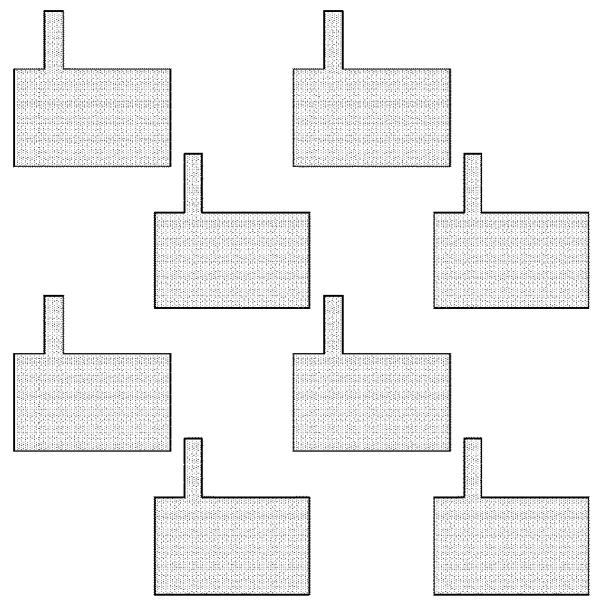
FIG. 18 illustrates a structural schematic diagram of a cathode layer structure obtained by evaporation using the mask in FIG. 17 for a first time.

Please refer to FIGS. 17-18, wherein FIG. 17 illustrates a structural schematic diagram of a mask used for cathode layer evaporation according to an embodiment of the present disclosure; FIG. 18 illustrates a structural schematic diagram of a cathode layer structure obtained by evaporation using the mask in FIG. 17 for the first time. In the present embodiment of the present disclosure, in the process of evaporation of the cathode layer, a mask 3 as shown in FIG. 17 is used, the mask 3 has an asymmetric T-shaped opening 4, and the T-shaped opening 4 has a strip-shaped portion 41 and a rectangle-shaped portion 42. In an extending direction of the strip-shaped portion 41, a center line of the strip-shaped portion 41 deviates for a distance from a center line of the rectangle-shaped portion 42. The evaporation process is implemented for a first time by using the mask 3 as shown in FIG. 17, during which the cathode material passes through the T-shaped opening 4 of the mask 3 and is deposited on the panel by evaporation so as to form the cathode layer structure as shown in FIG. 18. Then, the mask 3 is moved and the location of the mask 3 relative to the panel is changed, so that the opening 4 of the mask 3 is aligned with a position on the cathode layer structure which has no cathode material deposited, and then the evaporation process is implemented for a second time, during which the cathode material passes through the T-shaped opening 4 of the mask 3 and is deposited on the panel by evaporation so as to form the cathode layer structure as shown in FIG. 13. In such a manner, in the finally formed cathode layer, the strip-shaped protrusion area 51 is an overlap area formed by twice evaporation processes, and the flat area 52 is an area formed by only one time of evaporation process. With reference to FIG. 14, the thickness c3 of the strip-shaped protrusion area 51 of the cathode layer is larger than the thickness c4 of the flat area 52 of the cathode layer. As shown in FIG. 17, the distance a is set according to a width of the sub-pixel unit, it is set that the distance a is approximately equal to an odd times of a half width of one sub-pixel unit. Since the signal line is placed at the junction between adjacent sub-pixel units, with reference to FIGS. 15-16, the narrow portion 12 and strip-shaped protrusion area 51 can be located exactly where the signal line 7 is after the pattern of the cathode layer is aligned with the sub-pixel unit. The signal line 7 can be made of opaque metallic material so as to allow the signal transmission delay to be small, thereby improving the response speed of the display frame; further, since the signal line 7 overlaps with the narrow portion 12, the transmittance is increased, and the width of the narrow portion 12 is not needed to be reduced, so that the conductivity of the narrow portion 12 is not influenced, and thus the signal of the cathode layer can be uniformly transmitted to each sub-pixel unit, so as to achieve an uniformity of the display brightness of the sub-pixel units. As shown in FIG. 16, the strip-shaped protrusion area 51 overlaps with the signal line 7, as a result, the brightness is increased, it is not necessary to reduce the width of the strip-shaped protrusion area 51, and thus the overlap area of the cathode layer form by twice evaporation does not readily break, so that the conductivity of the narrow portion 12 is not influenced, and thus the signal of the cathode layer can be uniformly transmitted to each sub-pixel unit, so as to achieve an uniformity of the display brightness of the sub-pixel units.

For the transparent OLED panel in the embodiments of the present disclosure, the cathode layer structure having separate hollow areas can be achieved by evaporation. Both the narrow portion and the strip-shaped protrusion area overlap with the data line; compared with a solution that the signal line overlaps with the strip-shaped protrusion area or the narrow portion in the prior art, the influence of the cathode layer on the transmittance is decreased, thereby increasing the emission brightness while improving the transmittance.

Figure 19:
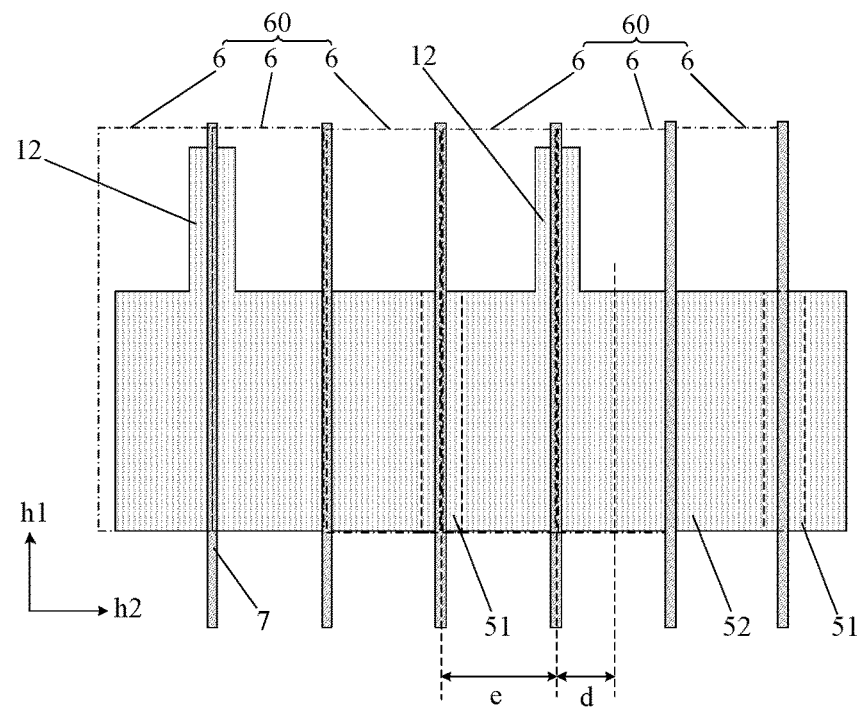
FIG. 19 illustrates a partial structural schematic diagram showing a cathode layer aligned with signal lines in a transparent OLED panel according to an embodiment of the present disclosure.
Figure 20:
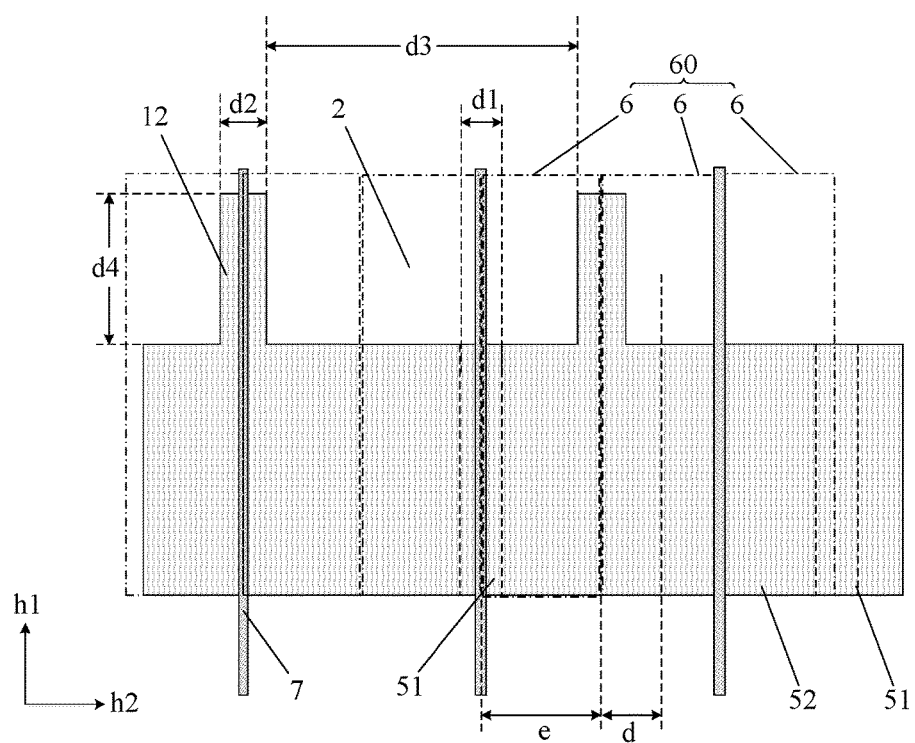
FIG. 20 illustrates a partial structural schematic diagram showing a cathode layer aligned with signal lines in another transparent OLED panel according to an embodiment of the present disclosure.

Optionally, please refer to FIGS. 19-20, wherein FIG. 19 illustrates a partial structural schematic diagram showing a cathode layer aligned with signal lines in a transparent OLED panel according to an embodiment of the present disclosure; and FIG. 20 illustrates a partial structural schematic diagram showing a cathode layer aligned with signal lines in another transparent OLED panel according to an embodiment of the present disclosure. The above-described panel includes a plurality of pixel units 60 distributed in a matrix (only two pixel units 60 are shown in FIGS. 19-20), each strip-shaped protrusion area 51 is located at the junction between two adjacent pixel units 60 in the second direction h2. The pixel unit 60 emits light individually and the transmittance at the junction between adjacent pixel units 60 is relatively low, the signal line 7 (which is also adverse to the transmittance) can be placed at the junction between two adjacent pixel units 60, thus, when the strip-shaped protrusion 51 (which is adverse to the transmittance) is also placed at the junction between two adjacent pixel units 60, the structures which are adverse to the transmittance overlap with each other, thereby reducing the adverse influence of the strip-shaped protrusion area 51 on the emission brightness, and thus improving the emission brightness.

Optionally, with reference to FIGS. 19-20, each pixel unit 60 includes three sub-pixel units 6 arranged along the second direction h2, each narrow portion 12 is located at the junction of two adjacent sub-pixel units 6 in each pixel unit 60. The organic light-emitting device includes a plurality of organic light-emitting device units, each sub-pixel unit 6 corresponds to one organic light-emitting unit, the sub-pixel unit 6 is the smallest light-emitting unit, and each sub-pixel unit 6 emits light individually, the transmittance at the junction of adjacent sub-pixel units 6 is relatively low, the signal line 7 (which is also adverse to the transmittance) is placed at the junction between two adjacent sub-pixel units 6, and the narrow protrusion 12 (which is adverse to the transmittance) is also placed at the junction between two adjacent sub-pixel units 6, that is, the structures which are adverse to the transmittance overlap with each other, thereby improving the transmittance.

Figure 21:
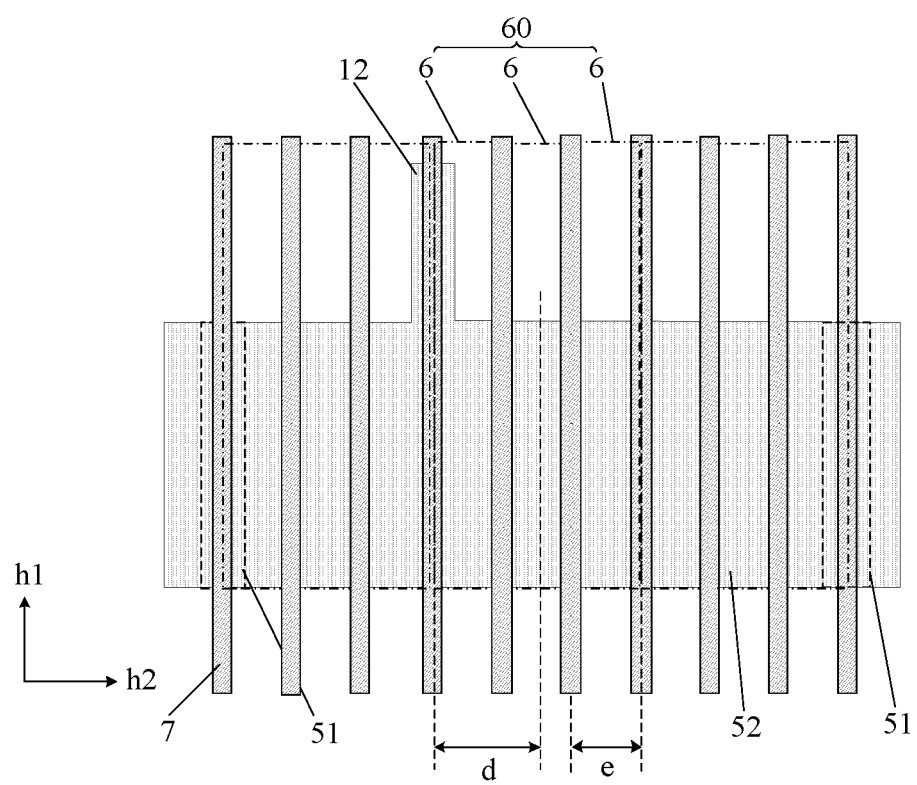
FIG. 21 illustrates a partial structural schematic diagram showing a cathode layer aligned with signal lines in another transparent OLED panel according to an embodiment of the present disclosure.

Optionally, please refer to FIGS. 19-21, wherein FIG. 21 illustrates a partial structural schematic diagram showing a cathode layer aligned with signal lines in another transparent OLED panel according to an embodiment of the present disclosure. In one flat area 52 and one adjacent narrow portion 12, the distance between the center line of the flat area 52 extending along the first direction h1 and the center line of the narrow portion 12 extending along the first direction h1 is d; a width of each sub-pixel unit 6 in the second direction h2 is e; $45\% \times e \times f < d < 55\% \times e \times f$, wherein, f is an odd number selected from 1 to 3, that is, d is approximately equal to odd times of a half of e. For example, in the structure shown in FIGS. 19-20, f=1, and d is approximately equal to a half of e; in the structure shown in FIG. 21, f=3, and d is approximately equal to three times of a half of d. With such a structure, the narrow portion 12 can be located exactly at the junction between two adjacent sub-pixel units 6, the transmittance at the junction of adjacent sub-pixel units 6 is relatively low, so that the narrow portion 12 can also be exactly placed at the junction between two adjacent sub-pixel units 6 to improve the transmittance.

Optionally, f=1, with such a structure, more signal lines 7 can overlap with the narrow portions 12 and the protrusion areas, thereby further improving the transmittance.

Optionally, with reference to FIG. 13, in the second direction h2, a difference between any two narrow portion intervals c1 is less than 5 μm, the narrow portion interval c1 refers to a distance between two adjacent narrow portions 12 in the second direction h2, a difference between any two strip-shaped protrusion intervals c2 is less than 5 μm, the strip-shaped protrusion interval c2 refers to a distance between two adjacent strip-shaped protrusion areas 51 in the second direction h2. The greater the intervals c1, the more non-uniform a distribution of the hollow areas 2 in the second direction h2; the hollow areas 2 are used for achieving transparency effect, therefore, when the interval c1 between any two adjacent narrow portions is less than 5 μm, that is, in the second direction h2, the hollow areas 2 are distributed approximately uniformly with identical intervals, the uniformity of the transparency effect can be improved. The greater the interval c2, the more non-uniform a distribution of low transmittance portions of the continuous coverage portion 11 (i.e., the strip-shaped protrusion areas 51), and the continuous coverage portion 11 are used for achieving light-emitting effect, therefore, when the interval c2 is less than 5 μm, that is, in the second direction h2, the low transmittance portions of the continuous coverage portion 11 are distributed approximately uniformly with identical intervals, the uniformity of the emission brightness can be improved.

Optionally, with reference to FIG. 19, at least one signal line 7 is placed between every two adjacent columns of sub-pixel units 6, the at least one signal line 7 includes data line, one column of data line correspondingly controls one column of sub-pixel units 6. In addition, two or more signal lines 7 can be placed between every two adjacent columns of sub-pixel units 6. In the present embodiment, the signal line 7 may further include other types of signal line in addition to the data line, for example, the signal line 7 further includes a power line, the power line is used to supply power to the organic light-emitting device so as to drive the organic light-emitting device to emit light, the data line is used to supply data voltage to a drive circuit of the organic light-emitting device, and the drive circuit of the organic light-emitting device controls a drive current value of the organic light-emitting device according to the data voltage, so as to achieve a display function. The embodiments of the present disclosure do not limit the types of the signal line, which can be set as needed by those skilled in the art. In the structure shown in FIG. 19, each column sub-pixel unit 6 needs to be provided with a corresponding signal line 7 by which a corresponding signal is transmitted to the column of sub-pixel units 6. The transmittance at the junction between adjacent sub-pixel units 6 is relatively low, in view of this, the signal line 7 corresponding to one of every two adjacent columns of sub-pixel units 6 is placed at the junction of the two adjacent columns of sub-pixel units 6, so as to reduce influence of the signal line 7 on the transmittance to the greatest extent, thereby further improving the transmittance and the emission brightness.

Optionally, with reference to FIG. 20, at least one signal line 7 is placed every two adjacent columns of the sub-pixel units 6, i.e., successively, every two adjacent columns of sub-pixels constitutes a group, and at least one signal line 7 is placed between every two adjacent groups. The signal 7 includes the date line. Differing from the structure shown in FIG. 19, in the structure shown in FIG. 20, one column of data line may correspondingly control two columns of sub-pixel units 6 adjacent to this column of data line, so that it can be set that the corresponding signal line 7 can be placed every two adjacent columns of the sub-pixel units 6. In the structure shown in FIG. 20, the signal lines 7 overlap with the narrow portion 12 and the strip-like protrusion area 51, thereby improving the transmittance and the emission brightness; in addition, even if there is no signal line 7 at the junctions of the sub-pixel units 6, other components except for the cathode layer still have lower transmittance at the junctions of the sub-pixel units 6 than at the middle portions of the sub-pixel units 6, therefore, if the narrow portion 12 is placed at the junction of the sub-pixel units 6 without the signal line 7, the transmittance can be improved; if the strip-shaped protrusion area 51 is placed at the junction of the sub-pixel units 6 without the signal line 7, the brightness can be increased.

Optionally, with reference to FIG. 14, the thickness c3 of the strip-shaped protrusion area 51 of the cathode layer is 1.8-2.2 times of the thickness c4 of the flat area 52 of the cathode layer. The thickness of the cathode layer is a size of the cathode layer in a direction perpendicular to the panel. Since the strip-shaped protrusion area 51 is formed by twice evaporation processes, while the flat area 52 is formed by only one time evaporation process, the thickness c3 of the strip-shaped protrusion area 51 of the cathode layer is approximately 2 times of the thickness c4 of the flat area 52 of the cathode layer. In addition, it should be noted that, the flat areas 52 of the cathode layer shown in FIG. 14 have an identical thickness; however, in the actual process, the thicknesses of the flat areas 52 formed by the twice evaporation processes may be different from each other due to an influence of the process error, for example, the thickness of the flat areas 52 formed by a first evaporation is 28 nm, the thickness of the flat areas 52 formed by a second evaporation is 33 nm, and the thickness of the strip-shaped protrusion areas 51 is equal to a sum of the thickness of the flat areas 52 formed by the first evaporation and the thickness of the flat areas 52 formed by the second evaporation, i.e., 61 nm. Therefore, the thickness c4 of the flat areas 52 of the cathode layer is an average thickness of all flat areas 52 of the entire cathode layer, that is, the thickness of the strip-shaped protrusion areas 51 is 1.8-2.2 times of the average thickness of the flat areas 52.

Optionally, with reference to FIG. 14, the thickness c3 of the strip-shaped protrusion areas 51 of cathode layer is 10-60 nm, and the thickness c3 of the strip-shaped protrusion areas 51 of cathode layer is determined by the thickness c4 of the flat areas 52 of the cathode layer. When the thickness of the cathode layer is too small, its resistance will be too great. In working process of the transparent OLED panel, the signal needs to be transmitted on the entire cathode layer, and a great cathode layer resistance will have an adverse influence on the signal transmission, not only increasing delay of the signal transmission thereby reducing the response speed of the display frame, but also causing great loss of the signal during transmission to different positions. Positions on the cathode layer closer to a cathode layer voltage signal source will get a larger voltage value, and positions on the cathode layer farther away from the cathode layer voltage signal source will get a smaller voltage value. When the voltage values received at different positions on the cathode layer are greatly different, poor uniformity of display brightness of the entire display panel will be caused. Big difference of the voltage values at different positions on the cathode layer leads to poor uniformity of the integral display brightness of the display panel, and great thickness of the cathode layer causes adverse influence on the transmittance of the cathode layer and thus reduces the display brightness. In view of these two factors, the thickness c4 of the flat areas 52 of the cathode layer is approximately 15 nm, and the thickness c3 of the strip-shaped protrusion areas 51 of the cathode layer is 10-60 nm, preferably 30 nm.

Optionally, with reference to FIG. 20, a width d1 of the strip-shaped protrusion area 51 in the second direction h2 is 2-20 μm. The cathode layer readily breaks when the width of the strip-shaped protrusion area is too small, not only increasing transmission delay of the signal and thus reducing response speed of the display frame, but also causing great difference of the voltages received at different positions on the cathode layer, for example, a distance between a first position on the cathode layer and the cathode layer voltage signal source is equal to a distance between a second position on the cathode layer and the cathode layer voltage signal source, however, an area of the cathode layer as the shortest path between the first position and the cathode layer voltage signal source is continuous, so that the cathode layer voltage signal source can transmit voltage signal to the first position via this shortest path, while the cathode layer voltage signal source needs to transmit voltage signal to the second position by avoiding the discontinuous areas of the cathode layer and going through a longer path. The longer the signal transmission path, the greater the loss of the voltage signal, which results in great difference between the voltage value at the first position and the voltage value at the second position, thereby influencing the display and resulting in poor uniformity of display brightness of the entire display panel. In addition, when the strip-shaped protrusion area is too wide, the transmittance will decrease, resulting in decrease of the display brightness. In view of these two factors, the width d1 of the strip-shaped protrusion area 51 in the second direction h2 is set at 2-20 μm.

Optionally, with reference to FIG. 20, a width d2 of the narrow portion 12 in the second direction h2 is 5-30 μm. In the first direction h1, the continuous coverage portions 11 are connected with each other via the narrow portions 12; in working process of the transparent OLED panel, the signal needs to be transmitted on the entire cathode layer, the narrow portions 12 are used for conducting different continuous coverage portions 11. When the width d2 of the narrow portion 12 in the second direction h2 is relatively smaller, the resistance of the narrow portion 12 will be greater, which is adverse to the signal transmission on the cathode layer, not only increasing delay of the signal transmission and thus reducing the response speed of the display frame, but also causing great loss of the signal during transmission to different positions. Positions on the cathode layer closer to a cathode layer voltage signal source will get a larger voltage value, and positions on the cathode layer farther away from the cathode layer voltage signal source will get a smaller voltage value. When the voltage values received at different positions on the cathode layer are greatly different, poor uniformity of display brightness of the entire display panel will be caused. When the width d2 of the narrow portion in the second direction h2 is relatively larger, the transmittance will decrease. In view of these factors, the width d2 of the narrow portion 12 in the second direction h2 is set at 5-30 μm.

Optionally, with reference to FIG. 20, a length d3 of the hollow area 2 in the second direction h2 is 10-100 μm. The length d3 of the hollow area 2 in the second direction h2 is determined by the width of sub-pixel unit 6 in the second direction h2. For example, when three sub-pixel units 6 correspond to one hollow area 2, the length d3 of the hollow area 2 in the second direction h2 is equal to a total width of three adjacent sub-pixel units 6 in the second direction h2 minus a preset width of the narrow portion 12. According to the width of the sub-pixel unit 6, the length d3 of the hollow area 2 in the second direction is 10-100 μm.

Optionally, with reference to FIG. 15, a width d4 of the hollow area 2 in the first direction h1 is 10-100 μm. The smaller the width d4 of the hollow area 2 in the first direction h1, the lower the transparency, and the higher the emission brightness; the larger the width d4 of the hollow area 2 in the first direction h1, the higher the transparency, and the lower the emission brightness. In view of the two factors, the width d4 of the hollow area 2 in the first direction h1 is 10-100 μm. Besides, the width d4 of the hollow area 2 is in relation to the width d2 of the narrow portion 12, and the larger the width d4 of the hollow area 2, the smaller the width d2 of the narrow portion 12. Therefore, the width d4 of the hollow area 2 needs to be determined by comprehensive consideration of the influence of the narrow portion 12 on the conductivity of the cathode layer.

It should be noted that, in the embodiments of the present disclosure, each sub-pixel unit 6 corresponds to one organic light-emitting device, and the above-described cathode layer is used as the cathode of the organic light-emitting device. In the present embodiments, only the configuration of the cathode layer in the transparent OLED panel, and the relation between the cathode layer and the signal line, the pixel unit and the sub-pixel unit are described, and other structures in the transparent OLED panel will not be limited.

Figure 22:
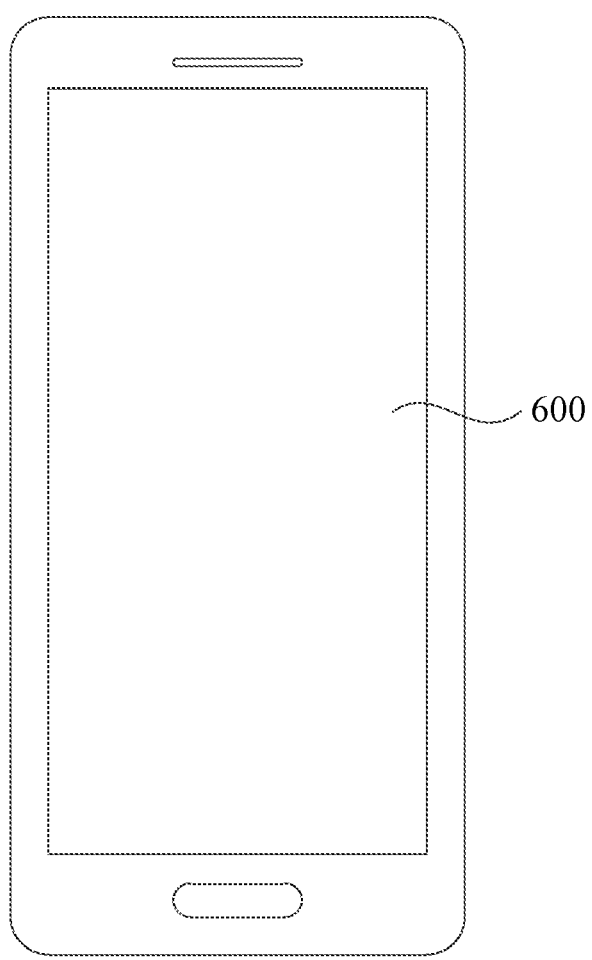
FIG. 22 illustrates a structural schematic diagram of a display device according to an embodiment of the present disclosure.

With reference to FIG. 22, which illustrates a structural schematic diagram of a display device according to an embodiment of the present disclosure, the embodiment of the present disclosure provide a display device, including the above-described transparent OLED panel 600.

The specific configuration and principle of the transparent OLED panel 600 are the same as those of the above-described embodiments, which will not be repeated herein. The display device may be any electronic device having a display function, such as a touch display screen, a cellphone, a tablet computer, a laptop, an e-book or a television.

For the display device in the embodiments of the present disclosure, the cathode layer structure having separate hollow areas can be achieved by evaporation; besides, compared with a solution that the signal line overlaps with the strip-shaped protrusion area or the narrow portion in the prior art, the signal line overlaps with both the narrow portion (which influences the transmittance) and the strip-shaped protrusion area of the cathode layer, so that the influence of the cathode layer on the transmittance is decreased, thereby increasing the emission brightness while improving the transmittance.

The above are merely preferred embodiments of the present disclosure, which are not used to limit the present disclosure. All the modifications, equivalent substitutions and improvements made within the spirit and principles of the present disclosure shall fall into the protection scope of the present disclosure.

What is claimed is:

1. A transparent organic light-emitting diode (OLED) panel, comprising:
   a substrate;
   a thin film transistor array layer located on the substrate;
   an organic light-emitting device located at a side of the thin film transistor array layer away from the substrate; and
   a plurality of signal lines;
   wherein the organic light-emitting device comprises a first electrode layer, a light-emitting layer and a second electrode layer; wherein the light-emitting layer is arranged at a side of the first electrode layer away from the substrate, and the second electrode layer is arranged at a side of the light-emitting layer away from the substrate, wherein at least one of the first electrode layer and the second electrode layer is a cathode layer,
   wherein the cathode layer comprises a cathode area and a plurality of hollow areas, the plurality of hollow areas is arranged in a first matrix, the cathode area comprises a plurality of continuous coverage portions and a plurality of narrow portions, and the plurality of narrow portions are arranged in a second matrix; in each row of the plurality of narrow portions, the narrow portions extend along a first direction and are arranged along a second direction perpendicular to the first direction; one of the continuous coverage portions is placed between every two adjacent rows of the plurality of hollow areas; in each row of the plurality of hollow areas, one of the narrow portions is placed between every two adjacent hollow areas; each of the continuous coverage portions comprises a plurality of flat areas and a plurality of strip-shaped protrusion areas, the plurality of flat areas is arranged along the second direction, and the plurality of strip-shaped protrusion areas extends along the first direction and is arranged along the second direction; one of the flat areas is placed between any two adjacent ones of the strip-shaped protrusion areas, and one of the strip-shaped protrusion areas is placed between any two adjacent ones of the flat areas, and a thickness of the protrusion areas of the cathode layer is larger than a thickness of the flat areas of the cathode layer; and the plurality of signal lines extends along the first direction; in a direction perpendicular to a plane where the transparent OLED panel is located, an orthogonal projection of the plurality of signal lines overlaps with an orthogonal projection of at least part of the narrow portions, and the orthogonal projection of the plurality of signal lines overlaps with an orthogonal projection of at least a part of the strip-shaped protrusion areas.

2. The transparent OLED panel according to claim 1, further comprising:
a plurality of pixel units arranged in a third matrix,
wherein each strip-shaped protrusion area is located at a junction between two adjacent pixel units in the second direction.

3. The transparent OLED panel according to claim 2, wherein,
each of the plurality of pixel units comprises three sub-pixel units arranged along the second direction, and each of the plurality of narrow portions is placed at a junction between two adjacent sub-pixel units in each pixel unit.

4. The transparent OLED panel according to claim 3, wherein,
in one of the flat areas and one of the narrow portions adjacent to the flat area, a distance between a center line of the flat area extending along the first direction and a center line of the narrow portion extending along the first direction is d;
a width of each sub-pixel unit in a second direction is e; and
45%×e×f<d<55%×e×f, wherein f is an odd number selected from 1 to 3.

5. The transparent OLED panel according to claim 4, wherein f=1.

6. The transparent OLED panel according to claim 4, wherein,
in the second direction, a difference between two adjacent narrow portion intervals is less than 5 μm, the narrow portion interval refers to a distance between two adjacent narrow portions in the second direction, a difference between any two strip-shaped protrusion intervals is less than 5 μm, and the strip-shaped protrusion interval refers to a distance between two adjacent strip-shaped protrusion areas in the second direction.

7. The transparent OLED panel according to claim 3, wherein,
at least one of the signal lines is placed between every two adjacent columns of the sub-pixel units.

8. The transparent OLED panel according to claim 3, wherein,
at least one of the signal lines is placed every two adjacent columns of the sub-pixel units.

9. The transparent OLED panel according to claim 1, wherein,
a thickness of the strip-shaped protrusion areas of the cathode layer is 1.8-2.2 times a thickness of the flat areas of the cathode layer.

10. The transparent OLED panel according to claim 9, wherein,
the thickness of the strip-shaped protrusion areas of the cathode layer is 10-60 nm.

11. The transparent OLED panel according to claim 1, wherein,
a width of each strip-shaped protrusion area in the second direction is 2-20 μm.

12. The transparent OLED panel according to claim 1, wherein,
a width of each narrow portion in the second direction is 5-30 μm.

13. The transparent OLED panel according to claim 1, wherein,
a length of each narrow portion in the second direction is 10-100 μm.

14. The transparent OLED panel according to claim 1, wherein,
a width of each narrow portion in the first direction is 10-100 μm.

15. A display device, comprising a transparent organic light-emitting diode (OLED) panel, wherein the transparent OLED panel comprises:
a substrate;
a thin film transistor array layer located on the substrate;
an organic light-emitting device located at a side of the thin film transistor array layer away from the substrate; and
a plurality of signal lines;
wherein the organic light-emitting device comprises a first electrode layer, a light-emitting layer and a second electrode layer; wherein the light-emitting layer is arranged at a side of the first electrode layer away from the substrate, and the second electrode layer is arranged at a side of the light-emitting layer away from the substrate, wherein at least one of the first electrode layer and the second electrode layer is a cathode layer,
wherein the cathode layer comprises a cathode area and a plurality of hollow areas, the plurality of hollow areas is arranged in a first matrix, the cathode area comprises a plurality of continuous coverage portions and a plurality of narrow portions, and the plurality of narrow portions are arranged in a second matrix; the narrow portions in each row of the plurality of narrow portions extend along a first direction and are arranged along a second direction perpendicular to the first direction, one of the continuous coverage portions is placed between every two adjacent rows of the plurality of hollow areas; in each row of the plurality of hollow areas, one of the narrow portions is placed between every two adjacent hollow areas; each of the continuous coverage portions comprises a plurality of flat areas and a plurality of strip-shaped protrusion areas, the plurality of flat areas is arranged along the second direction, and the plurality of strip-shaped protrusion areas extends along the first direction and is arranged along the second direction; one of the flat areas is placed between any two adjacent ones of the strip-shaped protrusion areas, and one of the strip-shaped protrusion areas is placed between any two adjacent ones of the flat areas, and a thickness of the protrusion areas of the cathode layer is larger than a thickness of the flat areas of the cathode layer; and the plurality of signal lines extends along the first direction; in a direction perpendicular to a plane where the transparent OLED panel is located, an orthogonal projection of the plurality of signal lines overlaps with an orthogonal projection of at least part of the narrow portions, and the orthogonal projection of the plurality of signal lines overlaps with an orthogonal projection of at least a part of the strip-shaped protrusion areas.

\* \* \* \* \*